United States Patent [19]

Hong

[11] 4,291,357

[45] Sep. 22, 1981

[54] SHORT CIRCUIT PROTECTION CIRCUIT

[75] Inventor: Ju-Hi J. Hong, Raleigh, N.C.

[73] Assignee: International Business Machines Corp., Armonk, N.Y.

[21] Appl. No.: 107,734

[22] Filed: Dec. 27, 1979

[51] Int. Cl.³ ............................................. H02H 9/02
[52] U.S. Cl. ...................................... 361/101; 361/92
[58] Field of Search ................ 361/93, 92, 101; 323/9

[56] References Cited

U.S. PATENT DOCUMENTS

| | | | |
|---|---|---|---|
| 3,160,767 | 12/1964 | Tindall | 361/93 |
| 3,748,569 | 7/1973 | Frank et al. | 323/9 |
| 3,753,078 | 8/1973 | Hedel | 323/9 |

*Primary Examiner*—J. D. Miller
*Assistant Examiner*—Reinhard J. Eisenzopf

*Attorney, Agent, or Firm*—James E. Murray

[57] ABSTRACT

A protection circuit is provided in which the output voltage is sensed and the output device is shut-off for protection when the output voltage falls below a predetermined trip voltage. The monolithic integrated circuit includes a voltage shifting circuit for transferring the output voltage to a biasing circuit which biases a switching circuit which turns the line driver off, when an overload or short circuit causes a voltage drop below a predetermined trip voltage. The protection circuit is disabled during start-up or signal rise time by splitting the input signal into two separate paths in which the signals have different delays. The shorter delay allowing the input signal to rise and to appear on the output line before the longer delay input signal rises enabling the protection circuit.

7 Claims, 3 Drawing Figures

SHORT CIRCUIT PROTECTION CIRCUIT

BACKGROUND OF THE INVENTION

This invention relates to protection circuitry for integrated circuits and, more particularly, to voltage sensing protection circuitry for a line driver which shuts off the line driver for short circuit or overload conditions and disables the protection circuitry during start-up and output low voltage signal rise times.

DESCRIPTION OF THE PRIOR ART

Output circuits such as line drivers for transmission lines and the like need some kind of protection circuitry in the event of a short circuit or severe power dissipating condition on the transmission line. The usual solution to the problem is to utilize a current sensing scheme, which essentially consists of a resistor connected between the power source and the load, and which essentially senses the current being supplied to the load. The large current sensing resistor is not integratable into a monolithic integrated circuit using today's technologies.

U.S. Pat. No. 3,753,078 is a good example of a protective arrangement which senses the output current and takes protective measures when the output current exceeds a certain normal operating value.

U.S. Pat. No. 3,748,569 is another example utilizing a voltage regulated power supply which utilizes a small series resistance to sense load current and further includes a protective circuit in the event of an overload condition.

The IBM Technical Disclosure Bulletin, Vol. 12, No. 11, Apr. 1970, page 2019, discloses a short circuit and overload protection circuit in which the current is sensed in a resistor and the corresponding voltage change fires a SCR when the current exceeds a predetermined value.

Protection circuits which sense the output voltage and shut off the output element when the output voltage drops below its normal up level voltage are not utilized since there is a false trip problem at start up or when the output voltage switches from the low level to the high level. The false trip problem is not present in the prior art current sensing schemes such as noted above.

SUMMARY OF THE INVENTION

The invention provides a short circuit or overload protection circuit for a line driver, in which the output voltage is sensed by a sensing circuit in which the circuit component values and supply voltage are selected to establish a trip voltage. The protection circuitry includes a voltage shifting circuit for transferring the output voltage to a biasing circuit which biases a switching circuit which turns the line driver off when an overload or short circuit causes a voltage drop below a predetermining trip voltage. Problem trip voltages are avoided by providing a longer delay path for the input signal to the switching transistor than the input delay obtained for the same signal in an input path to the output transistor. This difference in delay is utilized to disable the protection circuitry until the output voltage has risen to a value above the trip voltage.

It is the primary object of this invention to provide a voltage sensing protection circuit for a line driver in which false trip problems are eliminated.

It is another object of the present invention to provide a protection circuit in which the trip voltage level is simply set or changed.

It is a further object of the present invention to provide a protection circuit which is reset by removing the overload and providing the next low voltage state at the input.

It is another object of the present invention to provide a protection circuit in which the value of the emitter resistance which releases the protection circuit is larger than the value of emitter resistance at which the protection circuit is set so that oscillation is prevented.

DESCRIPTION OF THE PREFERRED EMBODIMENT

Figure 1:
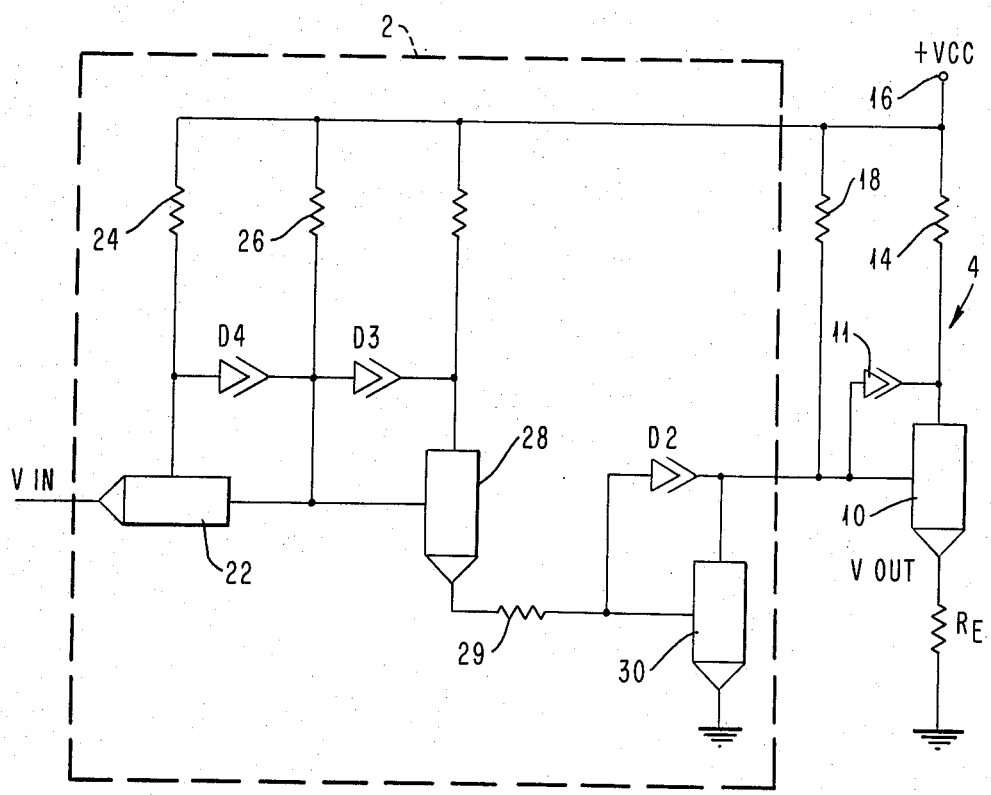
FIG. 1 is a schematic drawing showing a prior art Schottky barrier diode clamped input stage and a line driver.
Figure 2:
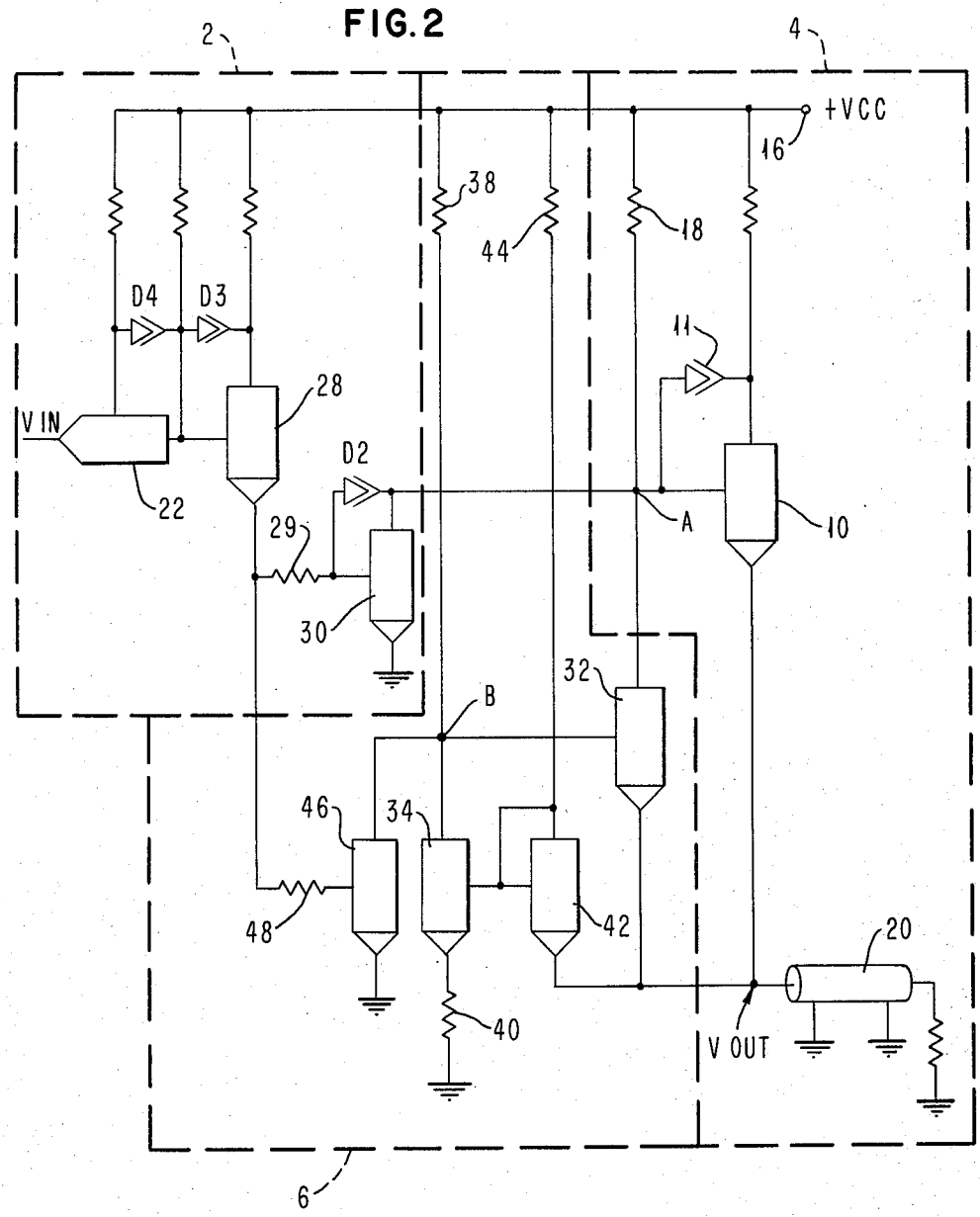
FIG. 2 is a schematic illustration of a short circuit or overload protected line driver.

Referring to FIG. 1, there is shown in schematic form an embodiment of the standard Schottky barrier diode clamped input stage 2 driving a line driver 4 without any short circuit or overload protection circuitry. The circuit comprises an NPN transistor 10 connected in the emitter follower mode and having a diode 11 connected between the base and the collector to prevent saturation of the transistor. A limiting resistor 14 has one end connected to the collector of transistor 10 and the other end connected to a voltage source 16. This resistance limits the power applied to the output line through transistor 10. A resistor 18 has one end connected to the voltage source 16 and the other end connected to the base of transistor 10. This resistor applies the biasing to the base of transistor 10. The output line is represented by the emitter resistor $R_E$ having one end connected to the emitter of transistor 10 and the other end connected to circuit ground. The standard Schottky barrier diode clamped TTL input stage 2 in conjunction with the line driver 4 operates in the following manner. When the input voltage Vin is at a low level at the emitter of transistor 22, the voltage source 16 in conjunction with the biasing resistor 24 provides forward biasing to the base-emitter junction of transistor 22 so that it is in the on or conducting condition. The current through resistor 26 produces a voltage drop thereacross which voltage is applied to the base of transistor 28 biasing the base to emitter junction in the reverse direction such that the transistor is cut-off. When transistor 28 is cut-off, the base of transistor 30 is at a positive potential relative to the grounded emitter thereof, such that the transistor is biased into the conducting stage. The current flowing through resistor 18 which has one end connected to the collector of transistor 30 and the other end to the base of transistor 10, provides a corresponding voltage drop which maintains the base-emitter junction of transistor 10 in the reverse biased state so that the output transistor 10 is off. Diodes D2, D3 and D4 are Schottky barrier diodes connected between the base and the collector of the respective transistors 30, 28 and 22 to keep them out of saturation When the input voltage Vin is at an up level, transistor 22 is biased into its off condition and transistor 28 is biased into its on condition via the source 16 and resistors 24 and 26 respectively. With transistor 28 conducting, the current through resistor 29 produces a voltage drop which biases the base-emitter junction of transistor 30 in the reverse direction, such that transistor 30 is off. This diminishes the current flow through resistor 18 thereby causing a voltage rise at the base of transistor 10 which forward biases the base-emitter junction providing turn-on of the transistor 10 establishing the output voltage Vout at the emitter thereof. The output voltage level, as well as the current output, are obviously functions of the load resistance $R_E$, and as $R_E$ approaches zero (short circuited output), the current output increases drastically from its normal value. This increased current condition, which causes failure of the line driver components, is prevented by the addition of the protection circuitry of this invention, shown in FIG. 2, which senses the line driver 4 output voltage Vout and shuts-off the output transistor 10 in response to voltage drop, such as caused by a short circuit, which brings the voltage below a predetermined preset trip threshold. The same reference numerals are used in FIG. 2 to identify the same components as are used in FIG. 1.

The protection circuit 6 consists of a bias switching transistor 32 having its collector connected to the base of output transistor 10 and its emitter connected to the load 20. The base of the transistor 32 is connected to the collector of transistor 34. Transistor 32 is biased on and off to switch the bias for turning output transistor 10 on and off. The transistor 34 has its collector also connected to the voltage source 16 through resistor 38 which essentially serves as the biasing resistor for bias switching transistor 32. The emitter of transistor 34 is connected to circuit ground through resistor 40. The base of the transistor 34 is connected directly to the base of transistor 42. The base and collector of transistor 42 are connected together so that the transistor operates as a diode. The emitter of transistor 42 is connected to the emitter of transistor 10. The collector of transistor 42 is connected to the voltage source 16 through resistor 44 which establishes a positive potential for forward biasing the diode connected transistor 42. Transistor 46 has its base connected to the emitter of transistor 28 through a resistor 48. The collector of transistor 46 is connected to the node B connecting the collector of transistor 34, the base of transistor 32 and the positive voltage source 16 through resistor 38. The emitter of transistor 46 is connected to circuit ground. It should be noted that transistor 46 is identical to transistor 30 except for the Schottky barrier diode connecting the base to the collector to prevent saturation, and that they are connected in parallel paths.

The operation of the protection circuit 6 can be explained as follows. In normal operation, when the input voltage to the input stage Vin is low, transistor 22 is conducting and transistor 28 is non-conducting. Transistors 30 and 46 are both on. The on-condiction of transistor 30 allows current to flow through resistor 18 providing a corresponding voltage drop which lowers the voltage at node A providing the reverse bias to the base-emitter junction of transistor 10 so that it is in the non-conducting or off state. Similarly, transistor 46, when it is in its on-conducting state, provides current flow through resistor 38 which results in a corresponding voltage drop at node B and, correspondingly, at the base of transistor 32. This low bias voltage at the base of transistor 32 keeps it in the off condition. When the voltage input Vin signal rises to the up state, transistor 22 is off and transistor 28 is on causing sufficient base current to flow through resistor 29 providing a corresponding voltage drop, which low voltage biases transistor 30 to its off condition. The same result occurs with respect to resistor 48 and transistor 46. It should be noted that transistor 30 has a Schottky barrier diode D2 connected between the base and collector to prevent saturation. It should also be noted that transistor 46 has no such saturation preventing diode connected between the base and collector. Accordingly, when transistor 30 cuts off the current through resistor 18, the voltage drop is less so that the voltage at node A rises providing sufficient positive voltage at the base of transistor 10 to forward bias the base to emitter junction and cause turn-on of the transistor. Transistor 46 saturates and, therefore, turn-off is much slower than the turn-off of transistor 30. Accordingly, the decrease in current through resistor 38 is at a slower rate and the voltage rise at node B is much slower than the voltage rise at node A. This delay in effect disables the protection circuit from sensing the low voltage at start up or at the low voltage portion of the rising output voltage. There are no problem trips during such a normal operation, transistor 32 remains cut off. Finally, when transistor 46 is completely off, the collector voltage of transistor 34 (node B) becomes a function of the output voltage Vout only, and the protection circuit becomes active, as will be explained.

If the output voltage Vout falls below a certain predetermined trip voltage, which is an indication of overload or short circuit, the current through resistor 38 decreases causing the voltage at node B to increase, which eventually turns on switching transistor 32, which in turn changes the bias at the base of the output transistor 10 to cut-off the current flow therethrough providing component protection from the overheating and subsequent burnout of the transistor. The short circuit or overload at the emitter or transistor 10 causes a severe increase in current and corresponding voltage drop. This low voltage is also seen at the emitter of transistor 42 which is connected to the emitter connected side of the load. Transistor 42 is connected as a diode by the direct connection between the base and the collector. Resistor 44 keeps the transistor 42 biased in the forward direction. Transistors 34 and 42 are selected with the same base-emitter voltage drop. Actually, monolithic integrated transistors on the same chip have equal base-emitter voltage drops. The bases of transistors 34 and 42 are common since they are connected together. The base is one base to emitter voltage above the output voltage Vout and since the base-emitter voltage drop of transistor 34 is the same as transistor 42, the emitter of transistor 34 is one base to emitter voltage below the base voltage or at Vout. As the output voltage Vout drops due to a short circuit, the voltage at the emitter of transistor 34 drops causing a current decrease through resistor 38 since the current through resistor 38 is proportional to the voltage potential at the emitter divided by the resistance of resistor 40. It should be appreciated that the current through resistor 38 is a function of the output voltage Vout only when transistor 46 is off. The corresponding voltage rise across resistor 38 is seen at node B and the base of transistor 32 connected thereto. This rise in voltage at the base of transistor 32 forward biases the base-emitter junction turning on the transistor 32, which provides a corresponding increase in current through resistor 18 increasing the voltage drop thereacross, thereby lowering the voltage at node A sufficiently to cut-off transistor 10.

Once transistor 32 turns on, the circuit enters into a positive feedback condition, which turns transistor 10 off completely, thus protecting it from excessive current stress.

The feedback path consists of the emitter connection of transistor 10 which sees a decrease in Vout as the transistor 10 cuts off. The lowered voltage is established at the emitter of transistor 34 as explained above. This results in a decreased current flow through resistor 38 and a corresponding increase of voltage thereacross, thus providing a further increase in voltage at node B, which turns transistor 32 on harder increasing the current flow through resistor 18, which increases the voltage drop, which further lowers the voltage at node A at the base of transistor 10 turning it off completely.

The trip voltage, at which the protection circuitry is operative to turn off the output transistor 10, is proportional to the supply voltage less the base to emitter voltage of transistor 32 and inversely proportional to the ratio of resistors 38 and 40. Since the supply voltage and the base to emitter voltage of transistor 32 are relatively stable over the entire operating temperature range and the on-chip tracking of resistors is good, the voltage trip can be set with a small error.

Figure 3:
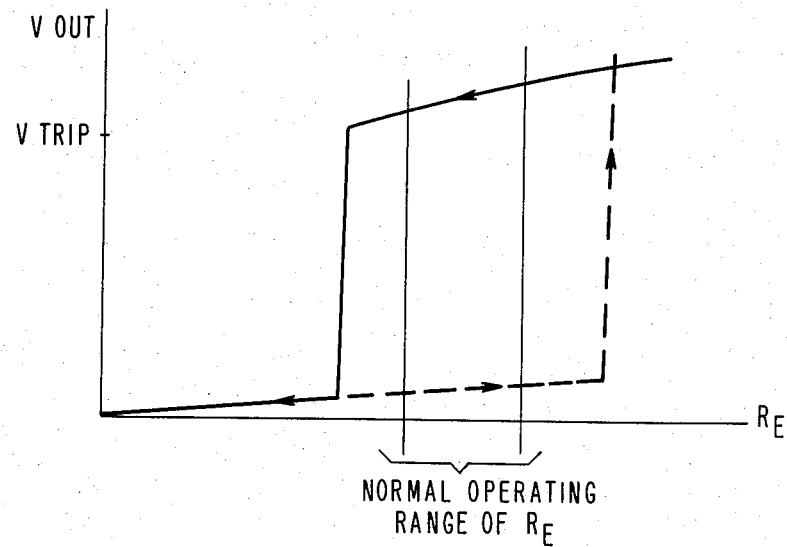
FIG. 3 is a plot of the output voltage trajectory vs. the emitter resistance of the line driver.

After the circuit is tripped, output transistor 10 remains turned off until the emitter resistance Re becomes sufficiently large. In most cases, the value of the emitter resistance Re which releases the protection circuit is larger than the normal operating value of $R_E$. FIG. 3 shows an output voltage trajectory of the output voltage Vout vs. the emitter resistance $R_E$. As the emitter resistance decreases, the output voltage drops and hits the trip voltage, the voltage drops sharply because of the shut-off of the output transistor 10 and then drops towards zero as the output transistor 10 is completely cut-off. It should be noted that the emitter resistance as it rises goes beyond the sharp voltage drop of the trip voltage and continues along the dashed line until a certain value at which the output transistor is turned on. The normal operating range of the emitter resistance is shown in the figure. The turn-on of the output transistor 10 is effected by the switching transistor 32 which has its emitter connected to the emitter of transistor 10 and is at Vout potential. As the emitter resistance $R_E$ increases, the base-emitter junction of Q2 becomes reverse biased and turns the transistor off. The decrease in current through resistor 18 results in a voltage rise thereacross which affects node A at the base of transistor 10 causing forward bias and a turning on of the transistor. It should be noted that the protection circuit is also released by changing the state of the input to the next low voltage input value. Therefore, no special reset pulse is needed.

While I have illustrated and described a preferred embodiment of my invention, it is to be understood that I do not limit myself to the precise construction herein disclosed and the right is reserved to all changes and modifications coming within the scope of the invention as defined in the appended claims.

Having thus described my invention, what I claim as new, and desire to secure by Letters Patent is:

1. A short circuit protection circuit for a line driver comprising:

an output transistor having an emitter output for connection between a source and a load and developing an output voltage;

a first bias resistor connected between the source and the base of said output transistor;

a switching transistor connected between the base of said output transistor and the load for switching the bias of said output transistor for on and off operation thereof;

a voltage tracking transistor coupled across the load and connected to the base of said switching transistor;

a second bias resistor connected between the source and the base of said switching transistor for developing a voltage thereacross which is a function of the output voltage and which is used to bias said switching transistor;

a first and second inverting transistor for providing an input signal in parallel at the base of said switching transistor and at the base of said output transistor, respectively, said first inverting transistor providing a later input signal response at the base of said switching transistor than the signal response at the base of said output transistor thereby disabling said protection circuit during low voltage portions of the output signal rise time.

2. A short circuit protection circuit for a line driver according to claim 1, wherein said tracking transistor is coupled to one end of the load through its base to emitter circuit, the base being connected to the base of a voltage shifting transistor connected as a diode and having its emitter connected to said load and its collector coupled to said source for transferring the output voltage to the emitter of said tracking transistor.

3. A short circuit protection circuit according to claim 1, wherein said tracking transistor is coupled to the other end of the load through a limiting resistor having one end connected to the emitter of said tracking transistor and the other end connected to the other end of the load.

4. A short circuit protection circuit for a line driver according to claim 1, wherein said switching transistor is biased on at the predetermined trip voltage which is proportional to the source voltage less the base-emitter voltage of said switching transistor and inversely proportional to the ratio of the second bias resistor to the limiting resistor.

5. A short circuit protection circuit for a line driver according to claim 1, wherein said second inverting transistor has a diode connected between its base and collector keeping it out of saturation and said first inverting transistor saturating producing a slow cut-off which provides the delay in input signal response at the base of said switching transistor.

6. A short circuit protection circuit according to claim 1, wherein said switching transistor turns off in response to reverse bias in the base-emitter circuit at a larger value of emitter resistance $R_E$ than the normal emitter resistance operating range, thereby preventing oscillation.

7. A short circuit protection circuit according to claim 1, wherein said output transistor is further turned off by positive feedback through said voltage shifting transistor, said tracking transistor, said second biasing resistor, said switching transistor and said first biasing resistor.

* * * * *